United States Patent [19]

Morikawa

[11] Patent Number: 5,288,338
[45] Date of Patent: Feb. 22, 1994

[54] SOLAR CELL AND METHOD OF PRODUCING THE SOLAR CELL

[75] Inventor: Hiroaki Morikawa, Itami, Japan

[73] Assignee: Mitsubishi Denki Kabushiki Kaisha, Tokyo, Japan

[21] Appl. No.: 928,747

[22] Filed: Aug. 13, 1992

Related U.S. Application Data

[63] Continuation-in-part of Ser. No. 704,209, May 22, 1991, abandoned.

[30] Foreign Application Priority Data

May 23, 1990 [JP] Japan ............................. 2-134843

[51] Int. Cl.$^5$ .................. H01L 31/06; H01L 31/075; H01L 31/18
[52] U.S. Cl. .................................... 136/249; 136/255; 136/258; 136/261; 437/2; 437/4; 257/458; 257/461
[58] Field of Search ........... 136/249 TJ, 255, 258 PC, 136/258 AM, 261; 437/2-5; 257/458, 461

[56] References Cited

FOREIGN PATENT DOCUMENTS

| | | | |
|---|---|---|---|
| 0092925 | 11/1983 | European Pat. Off. | 136/258 AM |
| 0093514 | 11/1983 | European Pat. Off. | 136/258 AM |
| 0113434 | 7/1984 | European Pat. Off. | 136/249 TJ |
| 2255025 | 7/1976 | Fed. Rep. of Germany | 136/255 |
| 62-183568 | 8/1987 | Japan | 136/258 AM |
| 1-140675 | 6/1989 | Japan | 136/258 AM |

OTHER PUBLICATIONS

K. Kawabata et al, *Conference Record, 21st IEEE Photovoltaic Specialists Conf*, May 1990, pp. 659–663.

Seippel, "Photovoltaics", Reston Publishing Company, Inc. Reston, Virginia, 1983, pp. 135–136.

Ng et al, "A Comparison of Majority- and Minority--Carrier Silicon MIS Solar Cells", IEEE Transactions on Electron Devices.

Vol. ED-27, No. 4, Apr. 1980, pp. 716–724 Zhong-Yang et al; "Optimum Design of a-Si/poly C–Si Stacked Solar Cell", Proceedings of the 2nd International Photovoltaic Science and Engineering Conference, Aug. 1986, pp. 394–397.

Yao et al, "Doped Microcrystalline Silicon Produced by LPCVD", Conference Record, 18th IEEE Photovoltaic Specialists Conference, Oct. 1985, pp. 1116–1120.

Pauwels et al, "Influence of an Insulating Layer of the Efficiency of a Semiconductor–Insulator–Semiconductor (SIS) Heterojunction Solar Cell", Solid State Electronics, vol. 21, 1978, pp. 693–698.

*Primary Examiner*—Aaron Weisstuch
*Attorney, Agent, or Firm*—Leydig, Voit & Mayer

[57] ABSTRACT

A solar cell includes a first conductivity type silicon substrate, a second conductivity type layer of microcrystalline or amorphous silicon deposited on the substrate in a plasma process and consuming an oxide film no more than 2 nanometers thick formed on the substrate before depositing the second conductivity type layer, a transparent electrode layer disposed on the second conductivity type layer, a grid electrode disposed on the transparent electrode layer, and an electrode disposed on the substrate. A method for producing a solar cell includes forming a silicon oxide film on a first conductivity type silicon substrate to a thickness not exceeding 2 nanometers by immersing the substrate in heated nitric acid, depositing a second conductivity type layer of microcrystalline or amorphous silicon on the silicon oxide film in a plasma, the silicon oxide film being consumed during deposition of the second conductivity type layer, and forming respective electrodes on the substrate and the second conductivity type layer.

6 Claims, 13 Drawing Sheets

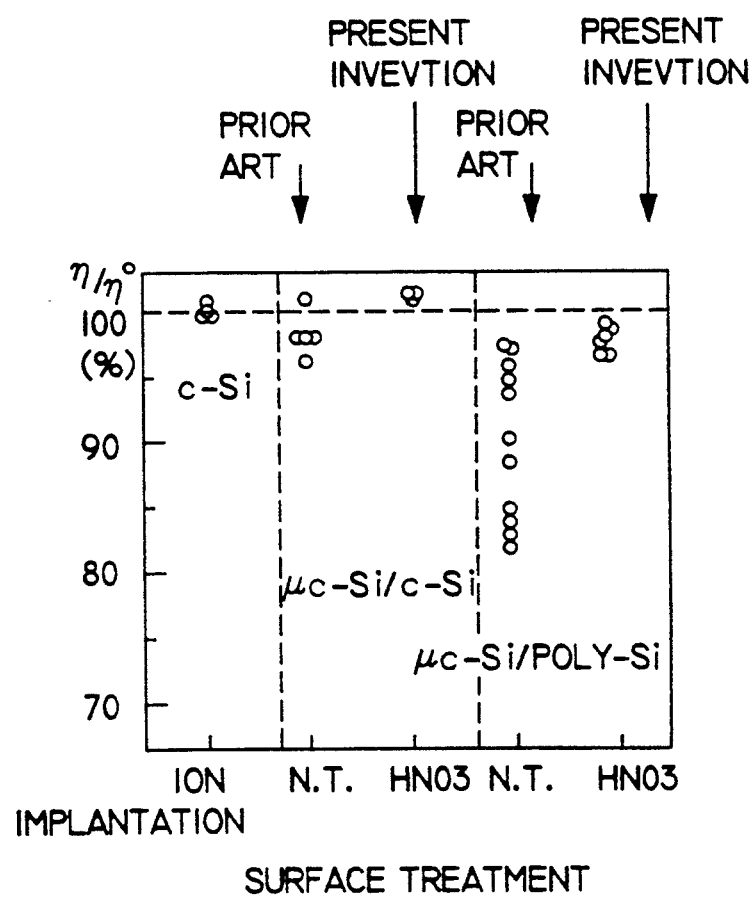

SOLAR CELL AND METHOD OF PRODUCING THE SOLAR CELL

This disclosure is a continuation-in-part of U.S. patent application No. 07/704,209, filed May 22, 1991, now abandoned.

FIELD OF THE INVENTION

The present invention relates to a solar cell and a method of making the solar cell.

BACKGROUND OF THE INVENTION

FIG. 1 is a cross-sectional view of a prior art tandem solar cell comprising an a-Si:H (hydrogenated amorphous silicon) n-i-p solar cell serially arranged on an a-Si:H/c-Si (crystalline silicon) solar cell disclosed in "Proceedings Of The 2nd International Photovoltaic Science And Engineering Conference", 1986, pages 394-397. A p-type crystalline silicon or polycrystalline silicon (poly-Si) substrate 1 has serially disposed on it an n-type hydrogenated amorphous silicon layer 3, a p-type a-Si:H layer 7, an intrinsic a-Si:H layer 8, an n-type a-Si:H layer 3a, and a transparent electrode layer 4. Grid electrodes 5 are selectively disposed on the transparent electrode layer 4 and a rear surface electrode layer 6 is disposed on the rear surface of the substrate 1.

The n-type a-Si:H layer 3, p-type a-Si:H layer 7, intrinsic a-Si:H layer 8, and n-type a-Si:H layer 3a are successively deposited on the p-type c-Si or poly-Si substrate 1 in a plasma chemical vapor deposition (CVD) process. The tandem structure includes an n-i-p solar cell comprising a-Si:H layers 3a, 8, and 7 serially connected with an n-type a-Si:H/p-type c-Si or poly-Si solar cell. An ITO (indium tin oxide) transparent electrode layer 4 is deposited on the n-type a-Si:H layer 3a by sputtering or evaporation. The grid electrodes 5, comprising silver and having a spacing of several centimeters, are printed on the transparent electrode layer 4. The rear surface electrode layer 6 is formed by sintering an aluminum paste applied to the rear surface of the substrate 1 before the a-Si:H layers are deposited.

In this tandem solar cell, light of relatively short wavelengths within the solar spectrum is converted into electricity by the n-i-p solar cell comprising the a-Si:H layers, and light that passes through the n-i-p solar cell is converted into electricity by the n-type a-Si:H/p-type c-Si or poly-Si solar cell. Thus, a wide range of the solar spectrum is utilized to generate electricity in the tandem solar cell.

FIG. 2 is a cross-sectional view of a prior art silicon microcrystalline ($\mu$c-Si:H) or a-Si:H/c-Si or poly-Si solar cell. An n-type c-Si or poly-Si substrate of 400 to 500 microns thickness has deposited on it a p-type $\mu$c-Si:H layer or an a-Si:H layer 3 100 to 200 angstroms thick and a transparent electrode layer 4. A comb-type electrode 5 is disposed on the transparent electrode 4 and a rear surface electrode 6 comprising silver 6,000 angstroms thick is disposed on the rear surface of the substrate 1.

The p-type $\mu$c-Si:H layer or a-Si:H layer 3 is deposited on an n-type c-Si or poly-Si substrate 1 in a plasma CVD process and the transparent electrode layer 4 is deposited by sputtering or evaporation. The rear surface electrode 6 is deposited on the rear surface of the substrate 1 and the grid electrodes 5 are deposited on the transparent electrode 4 by printing or evaporation.

In this $\mu$c-Si:H or a-Si:H/c-Si or poly-Si solar cell, a pn junction is present between the n-type c-Si or poly-Si substrate 1 and the p-type $\mu$c-Si:H layer 3. When sunlight is incident on the device, holes are produced in the substrate 1 and collected as a result of the potential gradient of the pn junction, thereby generating electricity.

FIG. 3 is a cross-sectional view of a MIS-type solar cell disclosed in "15th IEEE Photovoltaic Specialists Conference", 1981, pages 1405-1408. A p-type c-Si or poly-Si substrate 1 bears an oxide film 2. A collecting electrode layer 5 is disposed on the oxide film 2. A rear surface electrode layer 6 is disposed on the rear surface of the substrate 1.

The oxide film 2 is formed on the c-Si or poly-Si substrate 1 by thermal oxidation. An aluminum layer is deposited on the oxide film 2 by evaporation or sputtering and patterned by photolithography into a grid configuration having a spacing between grid fingers of several microns several tens of microns. The rear surface electrode 6 is formed by sintering aluminum paste which is deposited on the rear surface of the substrate before the oxide film 2 and the electrode layer 5 are formed. Metal M of the grid electrode pattern with the thin oxide film I and the c-Si or poly-Si substrate S comprise an MIS structure that generates electricity from light absorbed by the Si substrate. The range of the solar spectrum absorbed by the MIS structure is narrower than the range absorbed by the tandem structure.

In the prior art a-Si/c-Si or poly-Si solar cell constructed as described above, no matter how the c-Si or poly-Si substrate is cleaned, an interface state density of about $10^9 eV^{-1} cm^{-2}$ is present at the a-Si:H layer/c-Si or poly-Si junction interface, limiting the open circuit voltage $V_{oc}$. Furthermore, the open circuit voltage and the fill factor, i.e., the product of the current and the voltage corresponding to the optimum operation point of the solar cell divided by the product of the open circuit voltage $V_{oc}$ and the short circuit current $J_{sc}$, are lowered because the a-Si:H layer/c-Si or poly-Si interface is affected by the plasma in the plasma CVD process, increasing the interface state density. In addition, optical and electrical deterioration, such as the Staebler-Wronski effect, occurs, especially in the neighborhood of the interface, when light irradiates the cell for a long time.

There is no established theory explaining the cause of the degradation of cell performance. However, the following theory is advanced. Generally, in a-Si:H and $\mu$c-Si:H, silicon bonds which are not compensated by hydrogen are so-called "dangling" bonds. Since no atom is present at the end of a dangling bond, traps occur, adversely affecting the electrical characteristics of the non-crystalline silicon. In order to compensate the dangling bonds, hydrogen is added to the non-crystalline silicon and couples with the dangling bonds. However, when light irradiates the silicon, the hydrogen-silicon bonds are broken, resulting in degradation of the solar cell characteristics.

When an a-Si:H n-i-p solar cell is disposed on the a-Si:H/c-Si or poly-Si solar cell, in the tandem solar cell of FIG. 1, the same current must flow through both cells. Since the upper a-Si:H n-i-p solar cell has a smaller current output than the lower solar cell, the total output current is limited by the upper n-i-p solar cell. In the prior art $\mu$c-Si:H/c-Si or poly-Si solar cell, the solar cell characteristics, such as open circuit voltage, short-circuit current, fill factor, and the like, are not always good. In the prior art MIS solar cell, to make sufficient light incident on the c-Si or poly-Si substrate, patterning of a fine metal electrode having a width of 5 to 15 microns and a spacing interval of 50 to 120 microns is required. That patterning requires an expensive process, such as photolithography.

SUMMARY OF THE INVENTION

The present invention is directed to solving the above-described problems and has for its object to provide a solar cell with an interface state density at an a-Si:H/c-Si or poly-Si junction reduced by at least one order of magnitude compared to the prior art, a reduction in the increase in the interface state density due to plasma CVD processing, improved output characteristics, such as increased open circuit voltage, short-circuit current, and the like, in a tandem solar cell including an a-Si:H p-i-n solar cell.

In another aspect of the invention, a method for producing such a solar cell without using expensive processes, such as photolithography, is provided.

Other objects and advantages of the present invention will become apparent from the detailed description given hereinafter. The detailed description and specific embodiments are provided for illustration only since various additions and modifications within the spirit and scope of the invention will become apparent to those of skill in the art from the detailed description.

According to one aspect of the present invention, an oxide film having a thickness of no more than approximately 2 nanometers is formed on a c-Si or poly-Si substrate. A $\mu$c-Si:H layer or an a-Si:H layer is deposited in a plasma CVD process on and consuming the oxide film, resulting in a $\mu$c-Si:H, c-Si, or poly-Si solar cell having improved characteristics. The surface of the c-Si or poly-Si substrate is passivated by the oxide film no more than approximately 2 nanometers thick and the interface state density of the junction interface is reduced. The open circuit voltage of a solar cell according to the invention is about 20 mV larger than the prior art a-Si:H/c-Si or poly-Si solar cell. Since the oxide film does not directly damage the substrate even when variations arise in the plasma processing, it is possible to keep the interface state density at a low value so that degradation of electrical characteristics due to variations in the plasma processing does not occur and degradation of cell performance hardly arises. Since this solar cell according to the invention has a $\mu$c-Si:H or a-Si:H/c-Si or poly-Si structure, a tandem solar cell can be easily realized when the novel cell is serially arranged with an a-Si:H p-i-n solar cell.

In the present invention, the oxide film is formed by immersing the silicon substrate in heated nitric acid. Only the step of immersing the substrate in heated nitric acid is added to the prior art processing so there is almost no increase in processing steps or cost in practicing the invention yet a solar cell having superior performance is produced.

BRIEF DESCRIPTION OF THE DRAWINGS

FIG. 14 is a diagram showing the reliability of embodiments of the present invention and of prior art devices;

DETAILED DESCRIPTION OF THE PREFERRED EMBODIMENTS

Figure 4:
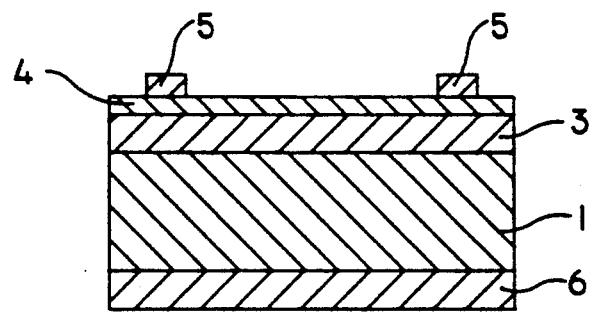
FIG. 4 is a cross-sectional view of a solar cell in accordance with an embodiment of the present invention.
Figure 5A:
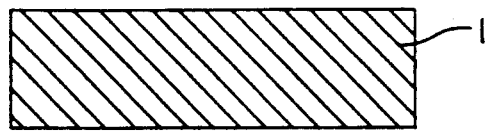
FIGS. 5(a) to 5(f) are cross-sectional views illustrating a method of producing the solar cell of FIG. 4.
Figure 5B:
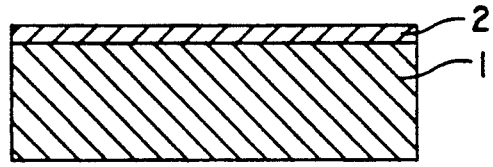
Figure 5C:
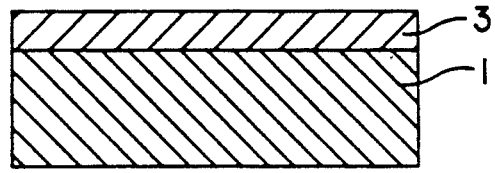

FIG. 4 is a cross-sectional view of a solar cell in accordance with an embodiment of the present invention. A method of producing the structure of FIG. 4 is illustrated in FIGS. 5(a) to 5(f). First, a c-Si or poly-Si substrate 1 is cleaned and immersed in hydrofluoric acid to remove the native oxide film. Thereafter, the substrate 1 is immersed in nitric acid heated to 70° to 100° C. whereby a thin oxide film 2 having a thickness of no more than approximately 2 nanometers is formed on the surface of the c-Si or poly-Si substrate 1 (FIGS. 5(a) and 5(b)). The thickness of the oxide film is altered by changing the duration of immersion of the substrate 1 in nitric acid, as illustrated in FIG. 6. In order to obtain a thickness of 2 nanometers or less, as shown in FIG. 6, the substrate is immersed for no more than about ten minutes.

Figure 7A:
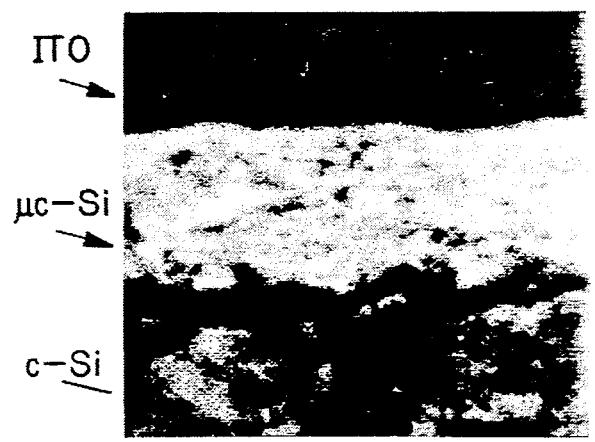
FIGS. 7(a) and 7(b) are transmission electron micrographs of a structure prepared according to the prior art and according to an embodiment of the present invention, respectively.
Figure 7B:
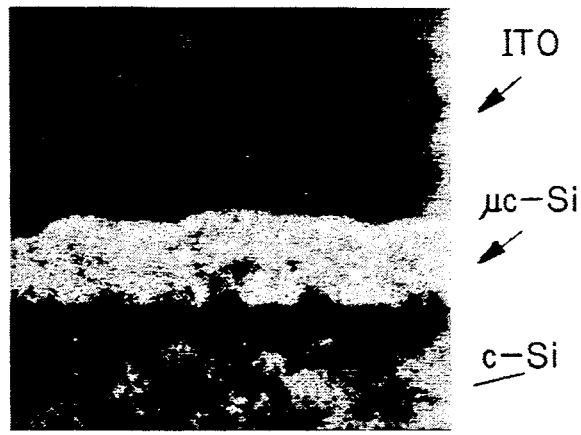

The subsequent process steps are the same as in the prior art. A p-type $\mu$c-Si:H layer 3 is deposited on the oxide film 2 in a plasma CVD process (FIG. 5(c)). During deposition of the $\mu$c-Si:H layer 3 in the plasma CVD process, the oxide film 2 is consumed and effectively disappears. The disappearance of the film has been confirmed by transmission electron microscopy. FIG. 7(b) is a micrograph of a structure including a crystalline silicon substrate, a $\mu$c-Si:H layer deposited on an oxide film 2 nanometers or less in thickness on the substrate, and a transparent electrode (ITO) layer. It is apparent from the micrograph that the oxide film formed by immersion of the substrate in nitric acid has disappeared during the deposition of the μc-Si:H layer 3.

Figure 5D:
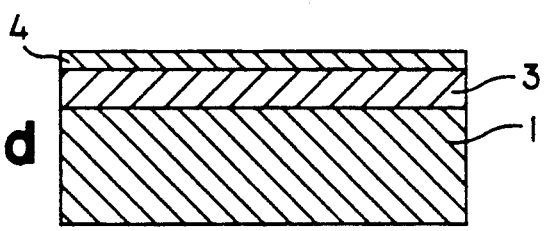
Figure 5E:
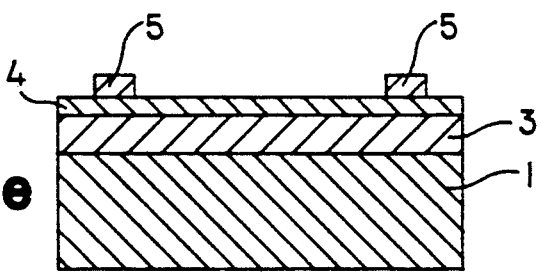
Figure 5F:
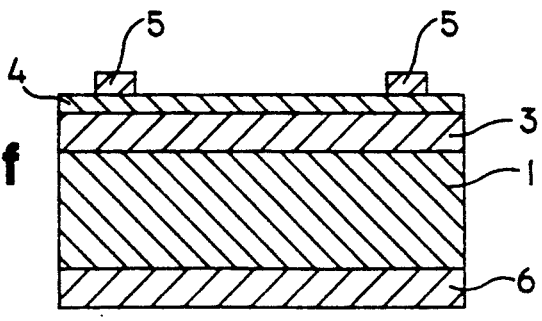
Figure 6:
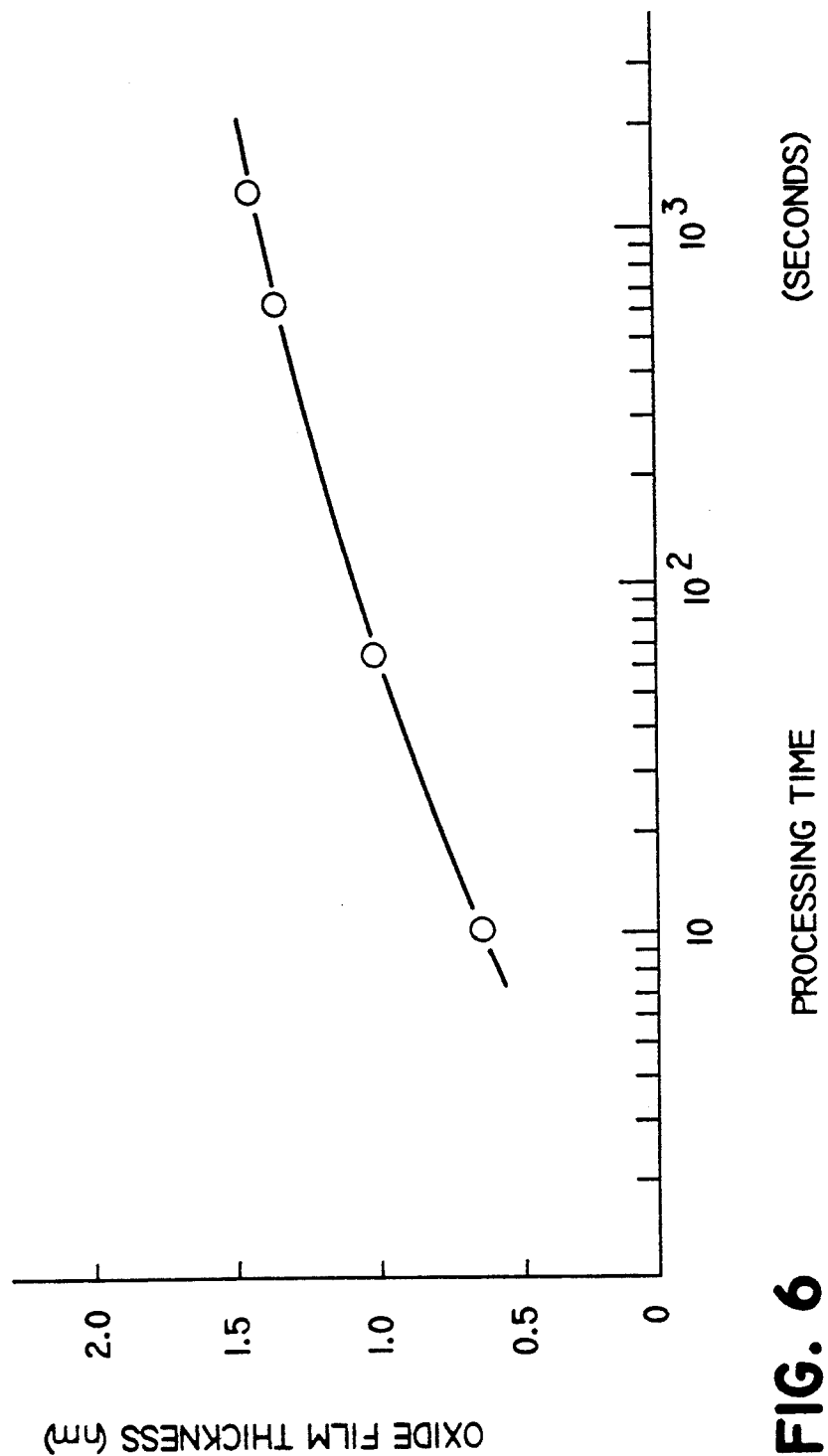
FIG. 6 is a diagram showing the relationship between the duration of immersion in nitric acid and the thickness of an oxide film on a silicon substrate produced in the nitric acid.

An ITO layer 4 is deposited on the μc-Si:H layer 3 (FIG. 5(d)), grid electrodes 5 are formed on the electrode layer 4 by silver printing (FIG. 5(e)). Finally, the rear surface electrode 6 is deposited (FIG. 5(f)) completing a μc-Si:H/c-Si or poly-Si solar cell.

Figure 1:
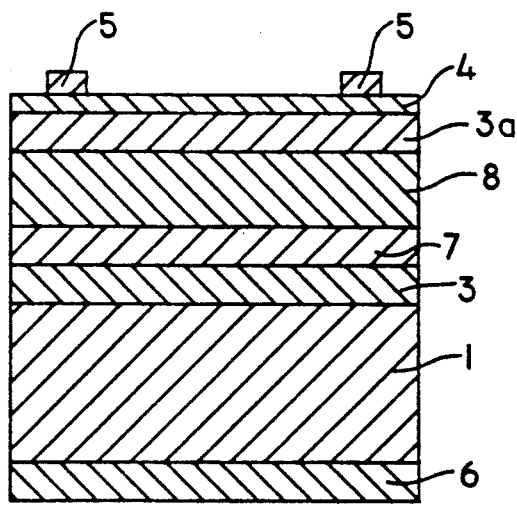
FIG. 1 is a cross-sectional view of a prior art a-Si:H/c-Si or poly-Si solar cell.
Figure 2:
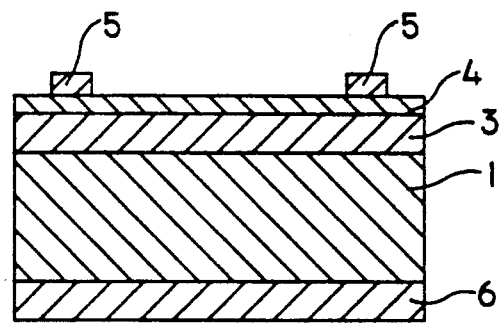
FIG. 2 is a cross-sectional view of a prior art $\mu$c-Si:H/c-Si or poly-Si solar cell.
Figure 8:
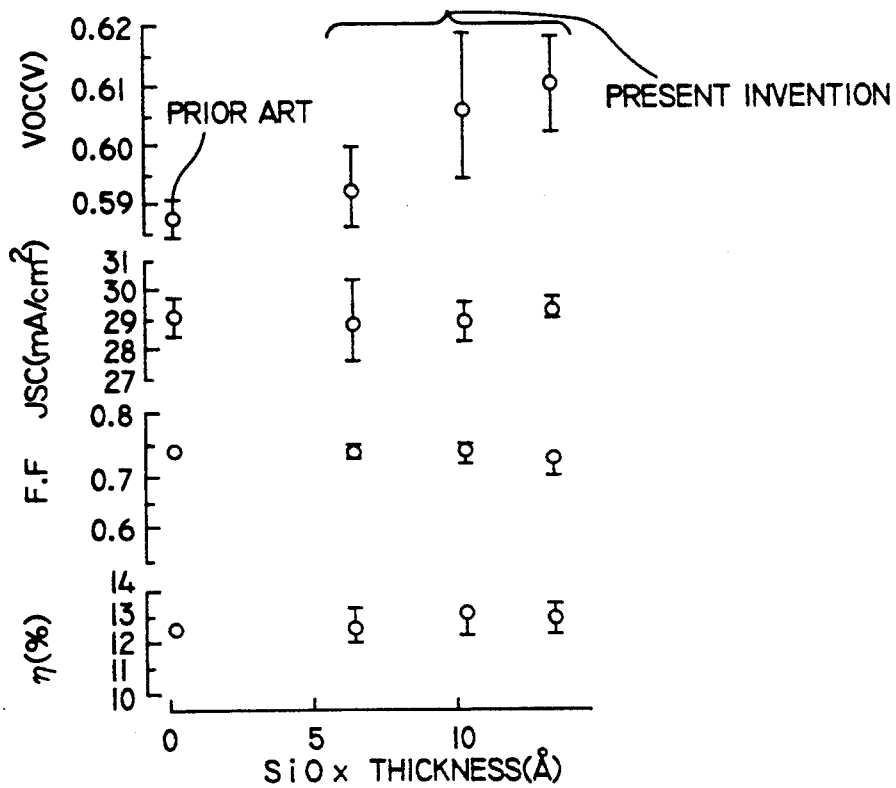
FIG. 8 is a diagram showing measured electrical characteristics of embodiments of the present invention and of prior art devices.

FIG. 8 shows the output characteristics of the prior art μc-Si:H/c-Si or poly-Si solar cells shown in FIG. 2 and the output characteristics of μc-Si:H/c-Si or poly-Si solar cells according to the present invention as shown in FIG. 4. In the μc-Si:H/c-Si or poly-Si solar cell structure according to the present invention, the open circuit voltage $V_{oc}$ is increased over the prior art structure. When the oxide film 2 is initially approximately 1 nanometer thick, the open circuit voltage increases by more than 20 mV. As a result, the conversion efficiency η is increased because the fill factor and short-circuit current are largely unchanged.

Figure 9:
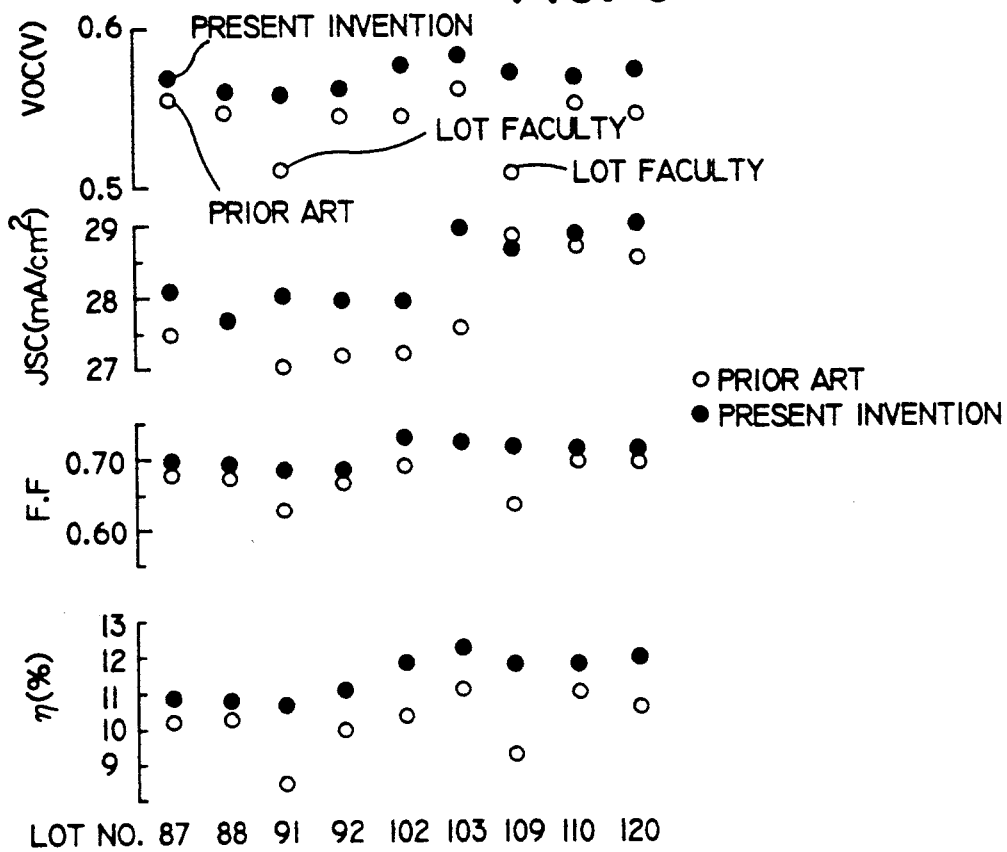
FIG. 9 is a diagram showing measured electrical characteristics of embodiments of the present invention and of prior art devices.
Figure 10A:
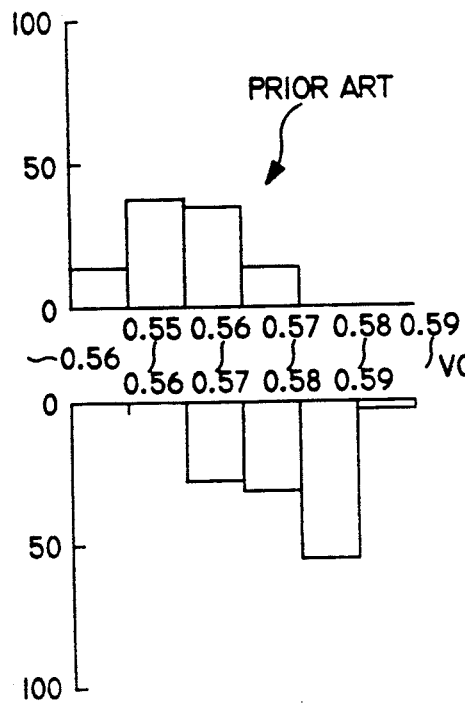
FIGS. 10(a) to 10(d) are graphs of the distribution of measured electrical characteristics of $\mu$c-Si:H/c-Si solar cells according to the invention and the prior art.
Figure 10B:
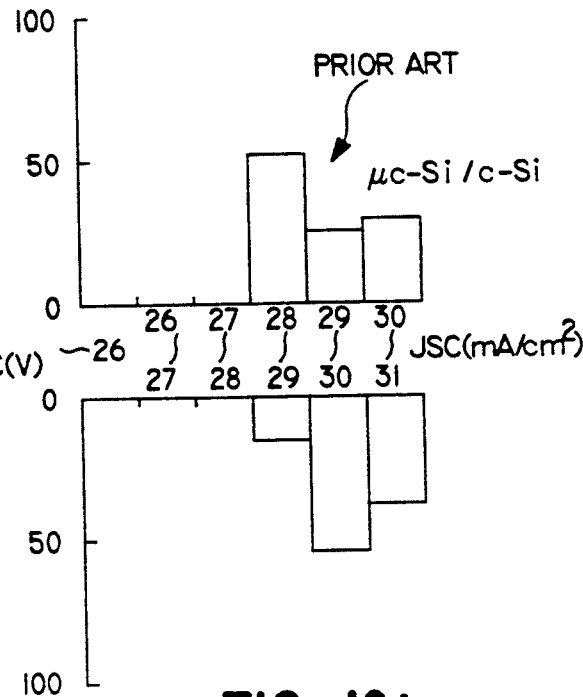
Figure 10C:
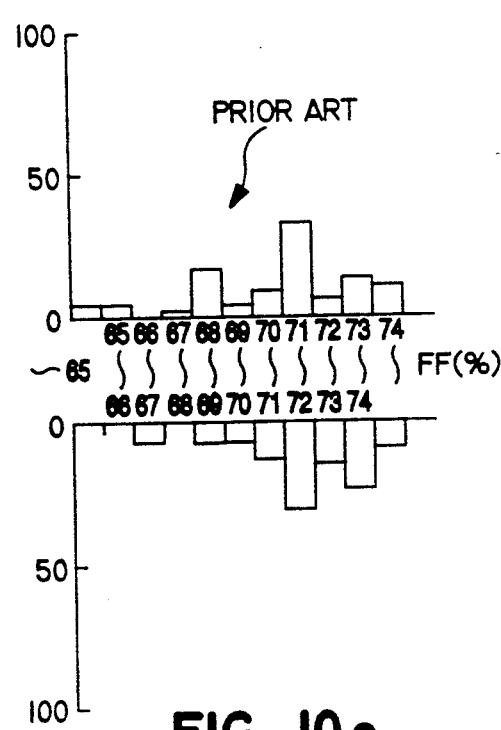
Figure 10D:
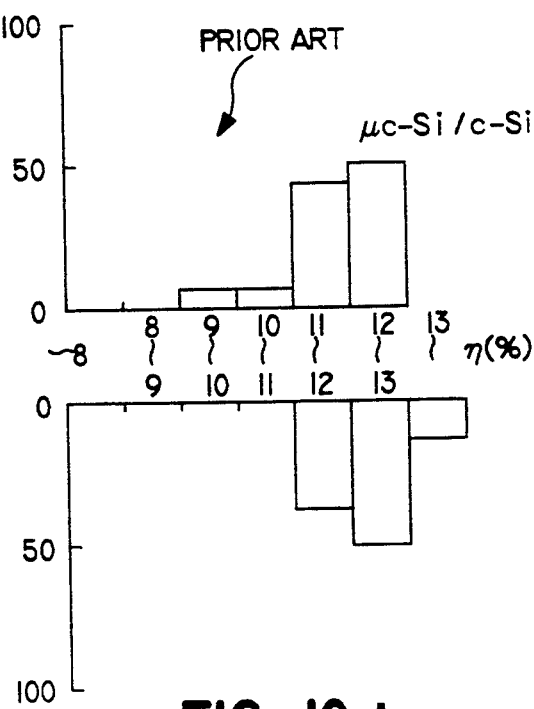
Figure 11A:
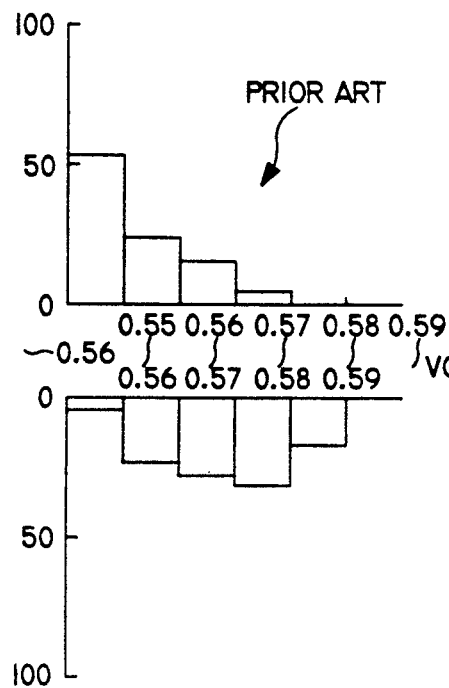
FIGS. 11(a) to 11(d) are graphs of the distribution of measured electrical characteristics of $\mu$c-Si:H/poly-Si solar cells according to the invention and the prior art.
Figure 11B:
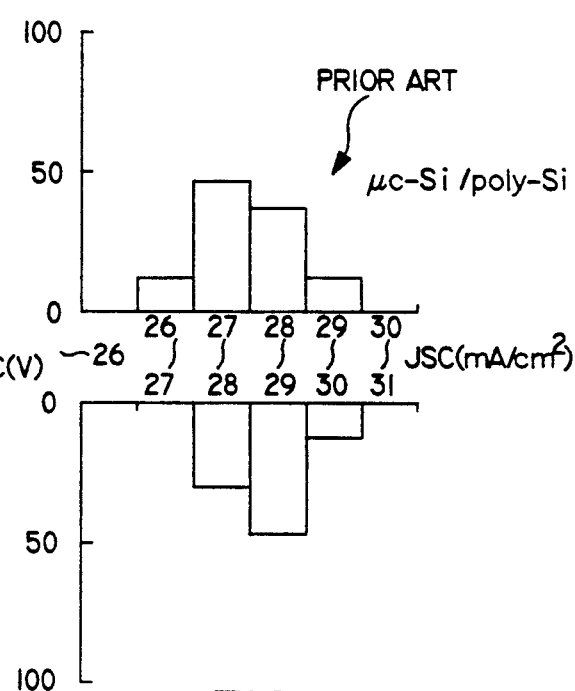
Figure 11C:
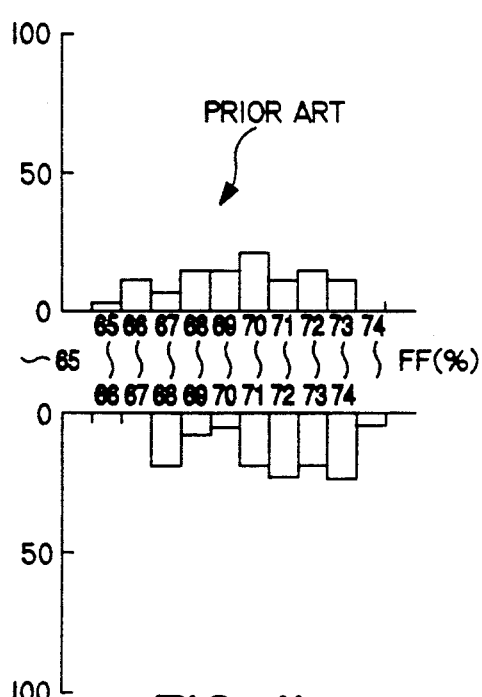
Figure 11D:
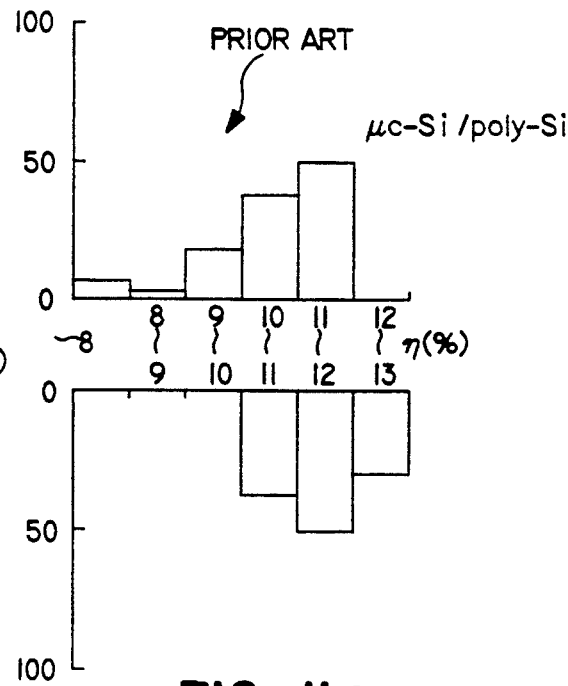

FIG. 9 shows cells prepared in lots from wafers introduced into a plasma CVD apparatus to form the p-type μc-Si:H layer. In processing prior art structures, lots 91 and 109 were faulty as a result of the plasma treatment in the plasma CVD apparatus. In making structures according to the present invention, however, no lots were faulty. The improvements in open circuit voltage and efficiency are apparent from FIG. 9.

Figure 12:
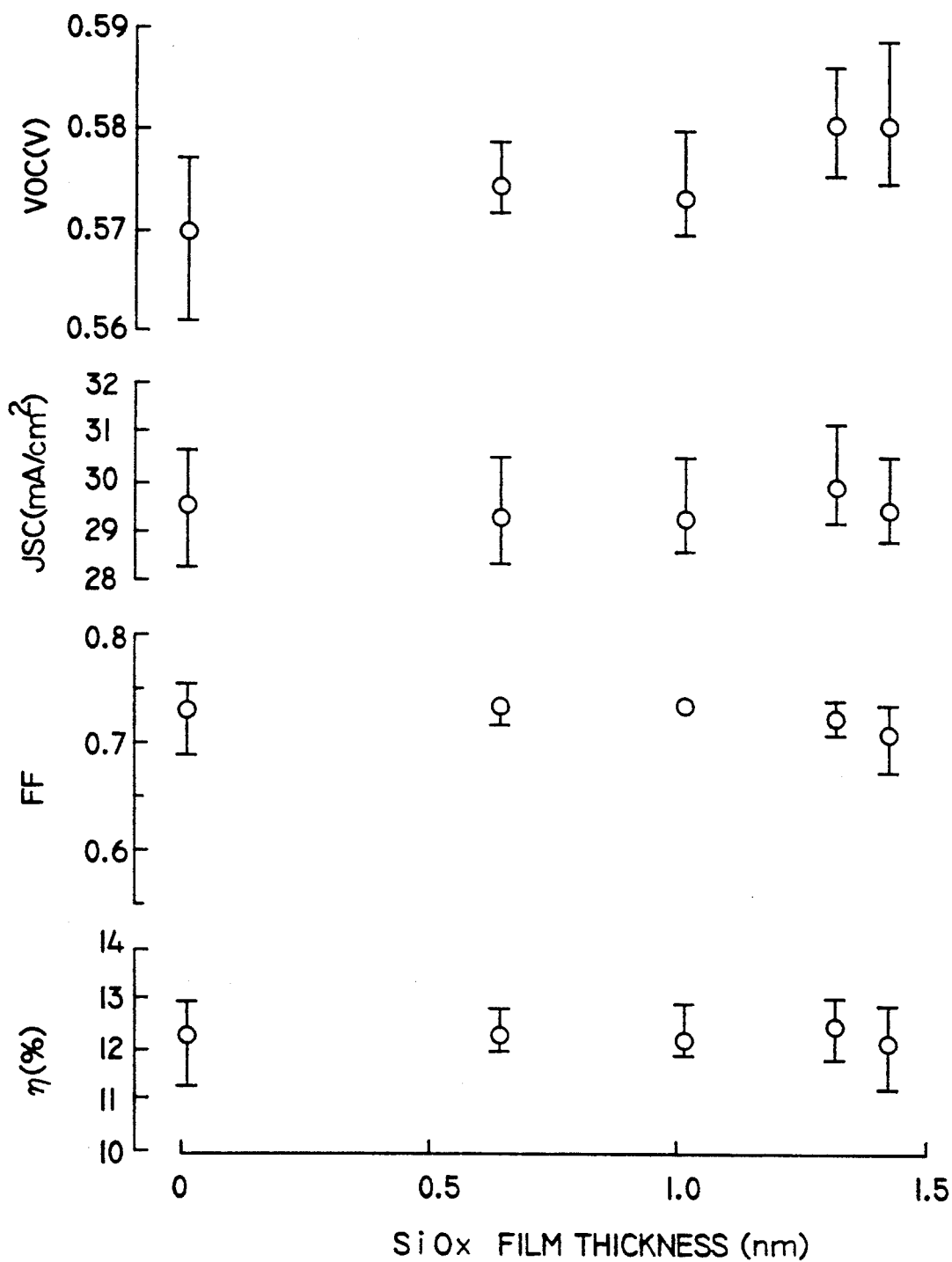
FIG. 12 is a diagram showing measured electrical characteristics of embodiments of the present invention and of prior art devices.
Figure 13:
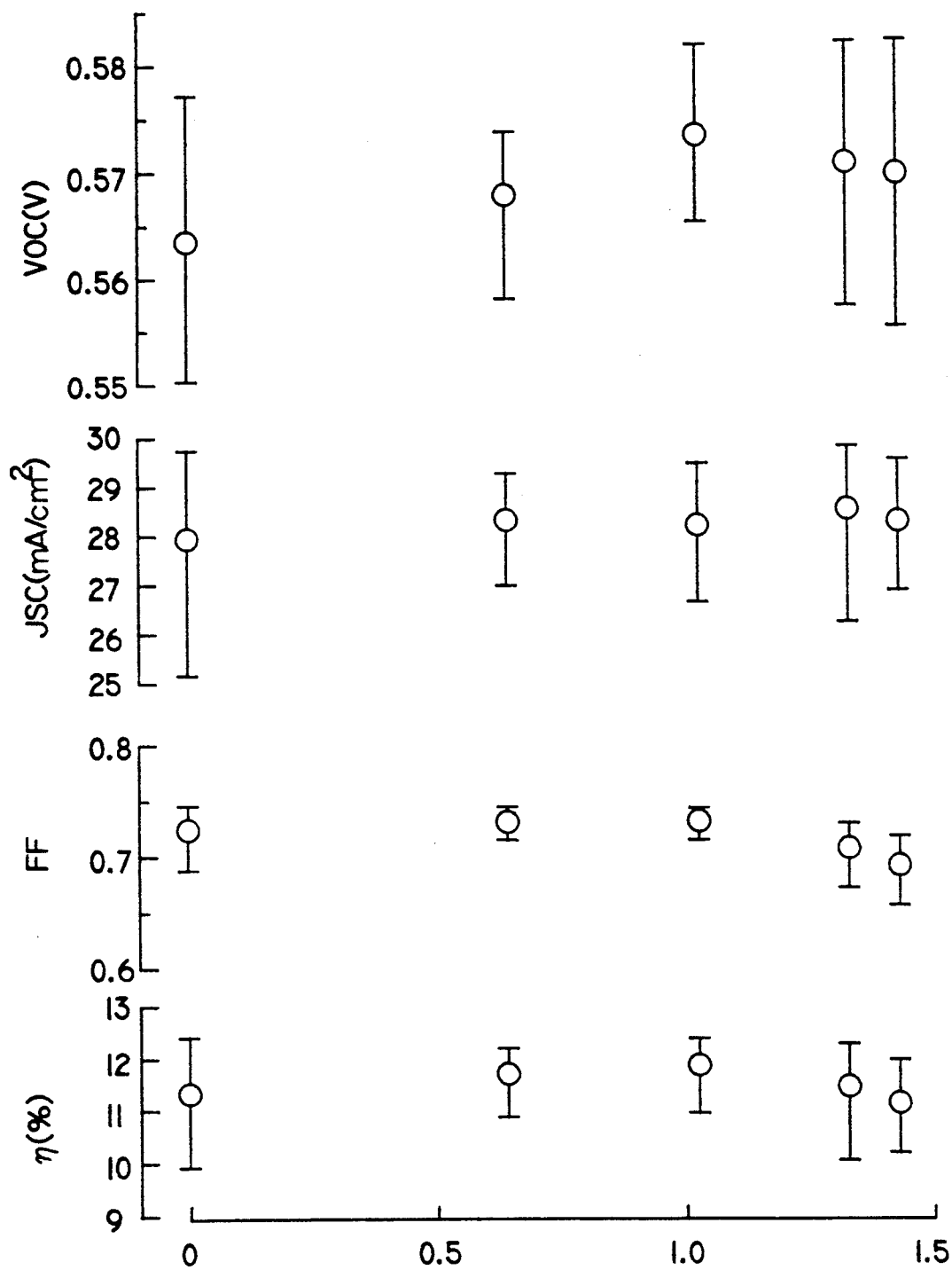
FIG. 13 is a diagram showing measured electrical characteristics of embodiments of the present invention and of prior art devices.

Additional measured data demonstrating the superior performance of solar cells according to the invention compared to prior art solar cells are shown in FIGS. 10(a) to 10(d), 11(a) to 11(d), 12, and 13. FIGS. 10(a) to 10(d) compare the distributions of measured open circuit voltage, short-circuit current, fill factor, and efficiency of μc-Si:H/c-Si solar cells according to the prior art with similar solar cells according to the invention. As in FIGS. 8 and 9, significant improvements in open circuit voltage and efficiency are achieved according to the invention. Similar measured distributions are shown in FIGS. 11(a) to 11(d) for μc-Si:H/poly-Si structures. The same kinds of improvements are achieved according to the invention as shown in FIGS. 10(a) to 10(d). FIGS. 12 and 13 report the same kinds of measured electrical characteristic data as FIG. 8 for μc-Si:H/c-Si and μc-Si:H/poly-Si structures, respectively, as a function of the initial thickness of the oxide film 2. The improvements in open circuit voltage and efficiency achieved in the invention are readily apparent in those figures.

In addition to improved electrical characteristics, in solar cell structures according to the invention, the interface between a c-Si substrate and the μc-Si:H layer is much more planar than in the prior art cells. The improved planarity is apparent by comparing FIGS. 7(a) and 7(b). FIG. 7(a) is a TEM micrograph of a cell prepared without an oxide film. FIG. 7(b) is a micrograph of a cell according to the invention. In addition, the entire surface of the μc-Si:H layer according to the invention exhibits regular, lattice-like patterns that are seen in only parts of the μc-Si:H layer deposited according to the prior art, i.e., without the initial oxide film. The μc-Si:H layer is also somewhat thinner when deposited under the same conditions according to the invention as compared to the prior art, e.g., 14 microns according to the invention versus 20 microns in the prior art. In structures like the embodiment shown in FIG. 7(b), the μc-Si:H layer 3 is typically deposited from silane in a concentration of 0.5 to 1 percent in a hydrogen carrier gas at a pressure of 0.5 to 2 Torr while applying a radio frequency power density of 0.02 to 0.1 W/cm$^2$.

FIG. 14 shows the degradation characteristics of solar cells after a light irradiation test. In the prior art structure, the characteristics are degraded using both a c-Si substrate and a poly-Si substrate. On the other hand, when a c-Si substrate is used as the substrate according to the present invention, there is no deterioration at all, and when a poly-Si substrate is used, there is almost no degradation. This result means that, in both cases, the interface state density is significantly reduced according to the present invention as compared with the prior art device.

Figure 3:
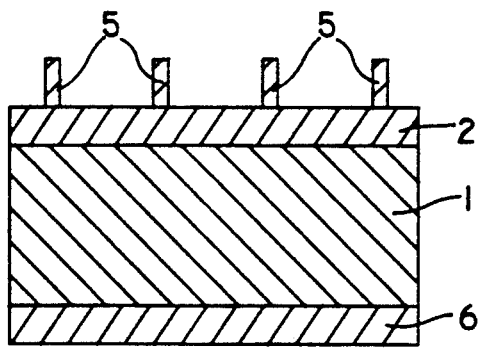
FIG. 3 is a cross-sectional view of a prior art MIS solar cell.

In order to evaluate the interface state density, a C-f measurement is generally carried out. When a junction has several levels of states, as in a μc-Si:H/c-Si junction, it cannot be clearly determined what portion of the interface is evaluated. For example, it is known from evaluation of MOS structures that an SiO$_2$ film has different interface state densities depending on the technique used to form the SiO$_2$ film. In the prior art MIS solar cell shown in FIG. 3, the open circuit voltage is increased by forming a silicon oxide film on the c-Si or poly-Si substrate. The open circuit voltage is increased because the silicon dangling bonds are compensated by oxygen and electrically inactivated.

In the present invention, however, while it is thought that the surface of the Si substrate is passivated by forming an oxide film and the density of states is also reduced, the interface state density of μc-Si:H may be smaller in the μc-Si:H/SiO$_x$ junction than in the μc-Si:H/c-Si or poly-Si junction. In other words, the evaluation of interface state density of the present invention includes the evaluation of the surface of the silicon substrate and the evaluation of the interface of μc-Si:H/SiO$_x$.

As described above, use of an oxide film according to the present invention improves the characteristics of the resulting solar cell even though the oxide film is consumed during the deposition of the μc-Si:H layer. Thus, the function of the oxide film in the present invention is quite different from that of the prior art shown in FIG. 3. The thin oxide film can be formed by any method in which the thickness of the oxide film can be controlled. While in the above embodiment an n-type c-Si or poly-Si substrate is used, a p-type c-Si or poly-Si substrate and a μc-Si:H or a-Si:H layer having an opposite conductivity type from the conductivity type of the embodiment described above can be employed.

Figure 15:
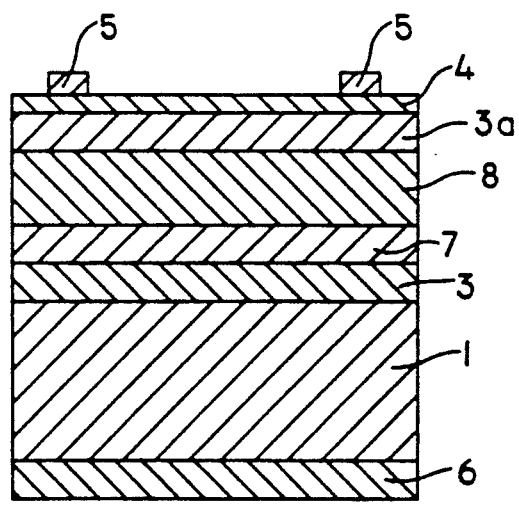
FIG. 15 is a cross-sectional view of an a-Si:H p-i-n/c-Si or poly-Si tandem solar cell in accordance with another embodiment of the present invention.

FIG. 15 is a cross-sectional view showing a tandem solar cell in accordance with a second embodiment of the present invention. An n-type μc-Si:H layer 7, an intrinsic a-Si:H layer 8, and a p-type μc-Si:H layer 3a are successively deposited on the p-type μc-Si:H/n-type c-Si or poly-Si solar cell according to the first embodiment, resulting in an a-Si:H p-i-n/c-Si or poly-Si tandem solar cell. In this tandem solar cell, it is possible to utilize the short wavelength light in the p-i-n cell that cannot be absorbed by the c-Si or poly-Si substrate.

Figure 16A:
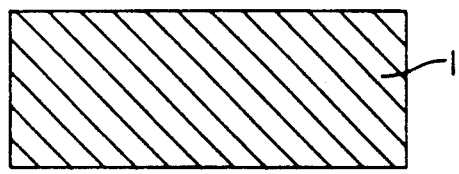
FIGS. 16(a) to 16(i) are cross-sectional views illustrating a method of producing the tandem solar cell of FIG. 15.
Figure 16B:
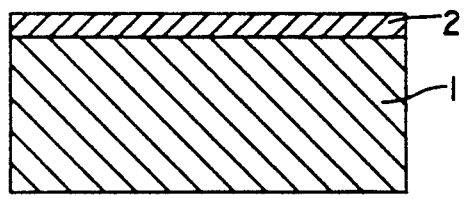
Figure 16C:
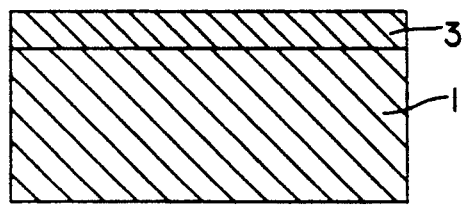
Figure 16D:
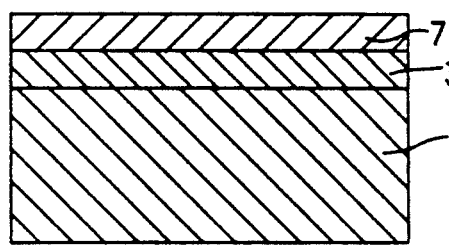
Figure 16E:
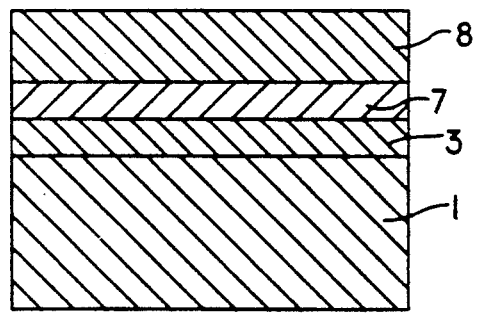
Figure 16F:
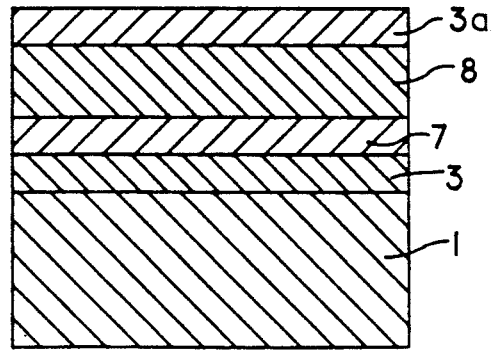
Figure 16G:
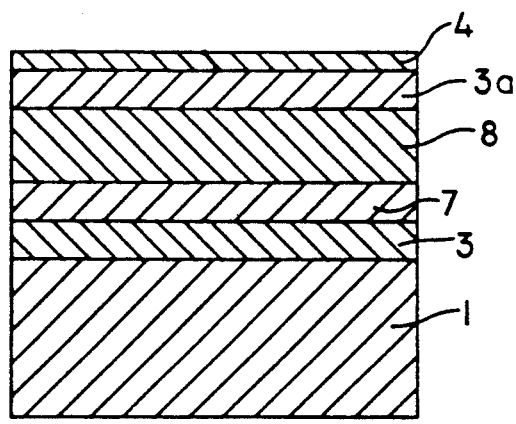
Figure 16H:
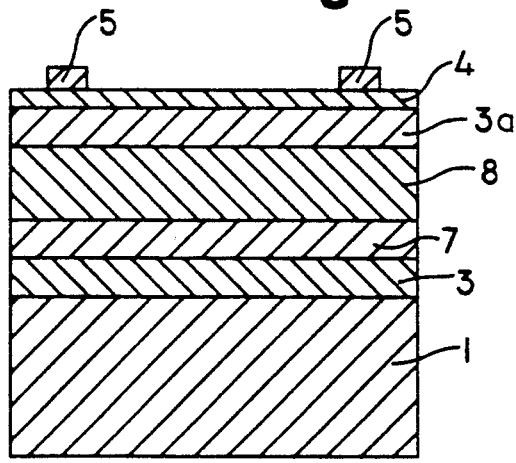
Figure 16I:
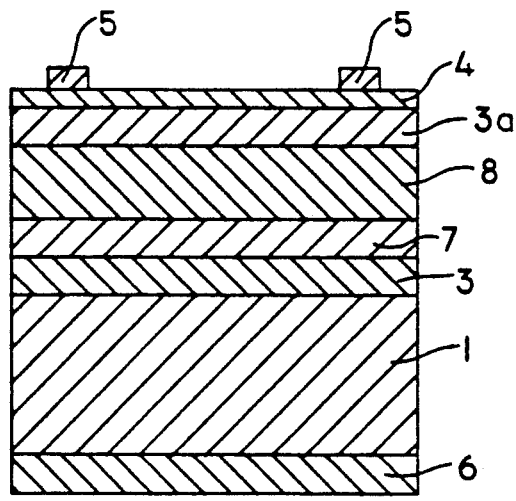

FIGS. 16(a) to 16(i) are cross-sectional views illustrating a method of producing the tandem solar cell of FIG. 15. In FIGS. 16(a) to 16(c), the same process steps as those illustrated in FIGS. 5(a) to 5(c) are carried out to form a structure in which the p-type μc-Si:H layer 3 is deposited on the n-type c-Si or poly-Si substrate 1 via the oxide film 2 that is consumed during the deposition of the layer 3. As shown in FIGS. 16(d) to 16(f), an n-type μc-Si:H layer 7, an intrinsic a-Si:H layer 8, and a p-type μc-Si:H layer 3a are successively deposited in a plasma CVD process. As shown in FIGS. 16(g) to 16(i), a transparent electrode layer 4 is deposited and grid electrodes 5 are silver printed, resulting in an a-Si:H p-i-n/μc-Si:H/c-Si or poly-Si tandem solar cell.

In this tandem solar cell, the open circuit voltage of the lower μc-Si:H/c-Si or poly-Si solar cell is increased as compared with the prior art tandem solar cell. The open circuit voltage of the tandem solar cell, which is the sum of the open circuit voltages of the solar cells of the tandem structure, is thereby increased. While the lower solar cell has a smaller output current than the upper a-Si:H n-i-p-type solar cell, since the short-circuit current of the lower μc-Si:H/c-Si or poly-Si solar cell is also improved, the output current of the tandem solar cell, which is determined by the solar cell having the lower short-circuit current, is increased over the prior art tandem structure.

I claim:

1. A solar cell comprising:
    a first conductivity type crystalline silicon substrate having opposed first and second surfaces;
    a second conductivity type layer of microcrystalline or amorphous silicon deposited on the first surface of the substrate in a plasma process and consuming an oxide film no more than 2 nanometers thick formed on the first surface of the substrate before depositing the second conductivity type layer;
    a transparent electrode layer disposed on the second conductivity type layer;
    a grid electrode disposed on the transparent electrode layer; and
    an electrode disposed on the second surface of the substrate.

2. The solar cell of claim 1 wherein the crystalline silicon substrate is chosen from the group consisting of monocrystalline and polycrystalline silicon.

3. A method for producing a solar cell, comprising:
    forming a silicon oxide film on a first surface of a first conductivity type crystalline silicon substrate to a thickness not exceeding 2 nanometers by immersing the substrate in heated nitric acid;
    depositing a second conductivity type layer of microcrystalline or amorphous silicon on the silicon oxide film in a plasma, the silicon oxide film being consumed during deposition of the second conductivity type layer; and
    forming respective first and second electrodes on a second surface of the substrate opposite the first surface and on the second conductivity type layer.

4. A tandem solar cell comprising:
    a first conductivity type crystalline silicon substrate having opposed first and second surfaces;
    a second conductivity type layer of microcrystalline or amorphous silicon deposited on the first surface of the substrate in a plasma process and consuming an oxide film no more than 2 nanometers thick formed on the first surface of the substrate before depositing the second conductivity type layer;
    a first conductivity type microcrystalline silicon layer disposed on the second conductivity type layer;
    an intrinsic amorphous silicon layer disposed on the first conductivity type microcrystalline silicon layer;
    a second second conductivity type microcrystalline silicon layer disposed on the intrinsic amorphous silicon layer;
    a transparent electrode disposed on the second microcrystalline silicon layer;
    a grid electrode disposed on the transparent electrode; and
    a rear surface electrode disposed on the second surface of the substrate.

5. The tandem solar cell of claim 4 wherein the crystalline silicon substrate is chosen from the group consisting of monocrystalline and polycrystalline silicon.

6. A method of producing a tandem solar cell, comprising:
    forming a silicon oxide film on a first surface of a crystalline silicon substrate to a thickness not exceeding 2 nanometers by immersing the substrate in heated nitric acid;
    depositing a second conductivity type layer of microcrystalline or amorphous silicon on the silicon oxide film in a plasma, the silicon oxide film being consumed during deposition of the second conductivity type layer;
    successively depositing on the second conductivity type layer a first conductivity type microcrystalline silicon layer, an intrinsic amorphous silicon layer, and a second second conductivity type microcrystalline silicon layer; and
    forming respective electrodes on a second surface of the substrate opposite the first surface and on the second second conductivity type layer.

* * * * *